United States Patent [19]

Igarashi

[11] Patent Number: 5,418,500
[45] Date of Patent: May 23, 1995

[54] HIGH-FREQUENCY OSCILLATOR CIRCUIT

[75] Inventor: Sadao Igarashi, Soma, Japan

[73] Assignee: Alps Electric Co., Ltd., Tokyo, Japan

[21] Appl. No.: 33,611

[22] Filed: Mar. 16, 1993

[30] Foreign Application Priority Data

Mar. 26, 1992 [JP] Japan ..................... 4-068577

[51] Int. Cl.$^6$ ............. H03B 5/12; H03B 25/00
[52] U.S. Cl. .................. 331/76; 331/117 R; 331/177 V
[58] Field of Search .......... 331/76, 117 R, 117 V

[56] References Cited

U.S. PATENT DOCUMENTS

| | | | |
|---|---|---|---|
| 3,289,106 | 11/1966 | Berkowitz | 331/76 |
| 4,479,259 | 10/1984 | Fenk | 455/318 |
| 4,527,130 | 7/1985 | Lutteke | 331/117 R |

FOREIGN PATENT DOCUMENTS 2351259  4/1975  Germany ............... 331/76

*Primary Examiner*—Andrew M. Dolinar
*Attorney, Agent, or Firm*—Guy W. Shoup; Patrick T. Bever

[57] ABSTRACT

A high-frequency oscillator circuit designed to efficiently output fundamental and second harmonic waves. A second harmonic resonance circuit is inserted between bases of a pair of transistors having collectors connected to each other. Each of a pair of capacitors is inserted between the base and an emitter of the corresponding one of the pair of transistors, and each of another pair of capacitors is inserted between the emitters of the transistors. Further, a pair of fundamental wave output terminals for outputting fundamental waves are respectively connected to the bases of the transistors, and a pair of second harmonic output terminals for outputting second harmonic waves are respectively connected to a connection between the second pair of capacitors and a connection point between the collectors of the pair of transistors.

5 Claims, 3 Drawing Sheets

HIGH-FREQUENCY OSCILLATOR CIRCUIT

BACKGROUND OF THE INVENTION

1. Field of the Invention

This invention relates to a high-frequency oscillator circuit which outputs fundamental and second harmonic waves, which can be used in motor vehicle telephone sets, cordless telephone sets, television tuner circuits, and the like, and which can be suitably arranged in the form of an integrated circuit.

2. Description of the Related Art

In the field of mobile communication, where a tendency to reduce the size of communication apparatus is shown, there is a need to provide a high-frequency oscillator circuit in the form of an integrated circuit. Also, it is important that a second harmonic can be efficiently extracted from such a high-frequency oscillator circuit.

FIG. 3 is a circuit diagram showing the construction of a conventional high-frequency oscillator circuit which outputs a fundamental wave and the second harmonic of the fundamental wave. The high-frequency oscillator circuit shown in FIG. 3 has a transistor 1 for high-frequency oscillation and amplification, a fundamental wave resonance circuit 2, formed of an inductor 3, a capacitor 4, and a variable capacitor diode 5 for tuning, and a second harmonic resonance circuit 6 formed of an inductor 7 and a capacitor 8.

A capacitor 9 serves to check a direct current. A frequency control voltage $V_{CTL}$ outputted from a frequency control circuit (not shown) is supplied to a frequency control terminal 11 which connects to the fundamental wave resonance circuit 2 through a resistor 10. The frequency of the fundamental wave oscillated in this high-frequency oscillator circuit is changed through the frequency control voltage $V_{CTL}$. A power supply voltage $V_{CC}$ is supplied to a power supply terminal 12. A bypass capacitor 13 is inserted between the power supply terminal 12 and ground.

Further, there are provided feedback capacitors 14 and 15, a constant-current circuit 16 capable of outputting a constant current, and resistors 17 and 18. The circuit elements 16 to 18 serve to bias the transistor 1 so that the transistor 1 operates at a predetermined operating point.

The collector of the transistor 1 is connected through a signal extraction capacitor 19 to a second harmonic output terminal 20 through which the second harmonic is outputted. The emitter of the transistor 1 is connected through a signal extraction capacitor 21 to a fundamental wave output terminal 22 through which the fundamental wave is outputted.

In the above-described high-frequency oscillator circuit, it is necessary to tune the second harmonic resonance circuit 6 in order to efficiently extract the second harmonic. However, the signal characteristics of the second harmonic resonance circuit 6 change through a wide frequency range, and it is therefore difficult to extract the second harmonic at a constant level through a wide frequency range. At frequencies above the UHF band, in particular, the power loss in the second harmonic resonance circuit 6 is large and the output power cannot be efficiently extracted.

There is also the problem of a reduction in carrier to noise (C/N) ratio with respect to both the fundamental and harmonic waves, because the second harmonic resonance circuit 6 influences the oscillation of the fundamental wave.

Moreover, for tuning the second harmonic resonance circuit 6, adjustment of inductor 7 and capacitor 8 is required. It is therefore difficult to design the oscillator circuit as an integrated circuit.

SUMMARY OF THE INVENTION

In view of the above-described circumstances, an object of the present invention is to provide a circuit arrangement for a high-frequency oscillation circuit capable of extracting second harmonic waves at a high level through a wide frequency range, having improved C/N ratios, and capable of being formed as an integrated circuit.

To achieve this object, according to the present invention, there is provided a high-frequency oscillator circuit comprising a pair of first and second transistors for high-frequency oscillation, the first and second transistors having collectors connected to each other, a first impedance circuit and a second impedance circuit each inserted between a base and an emitter of the corresponding one of the first and second transistors, a third impedance circuit inserted between the emitters of the first and second transistors, and a fourth impedance circuit inserted between the bases of the first and second transistors. In this high-frequency oscillator circuit, a second harmonic wave is outputted from at least one of virtual grounding points of a balanced circuit formed of the first and second transistors and the first to fourth impedance circuits.

DESCRIPTION OF THE PREFERRED EMBODIMENTS

Preferred embodiments of the present invention will be described below with reference to the accompanying drawings.

Figure 1:
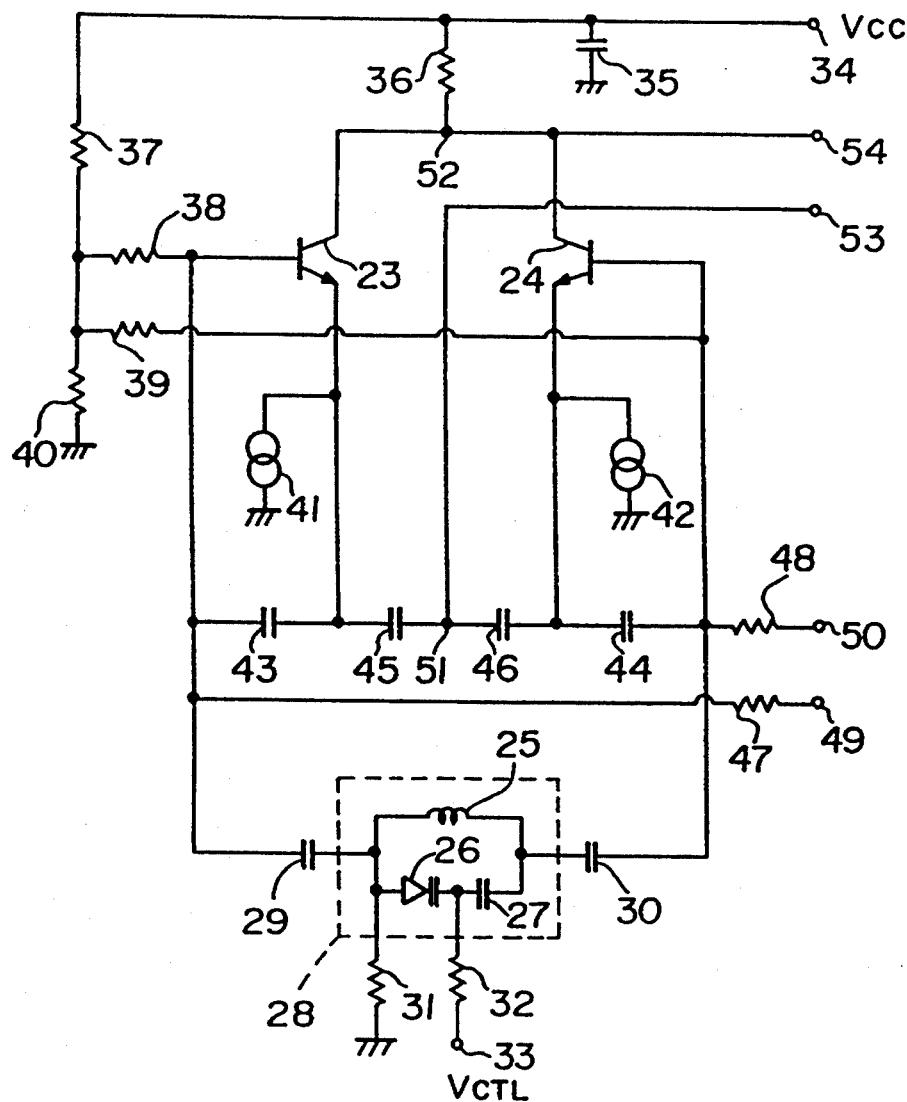
FIG. 1 is a circuit diagram of a high-frequency oscillator circuit in accordance with a first embodiment of the present invention.

FIG. 1 shows a balance-type high-frequency oscillator circuit for outputting a fundamental wave and the second harmonic of the fundamental wave in accordance with a first embodiment of the present invention. This high-frequency oscillator circuit is a Colpitts type oscillator circuit.

Transistors 23 and 24 shown in FIG. 1 are uniform in characteristics with each other and serve for high-frequency oscillation and amplification. An inductor 25, a variable capacity diode 26 for tuning, and a capacitor 27 form a fundamental wave resonance circuit 28 surrounded by the broken line. To the fundamental wave resonance circuit 28 are connected capacitors 29 and 30 for checking direct currents, and resistors 31 and 32. A frequency control voltage $V_{CTL}$ outputted from a frequency control circuit (not shown) is supplied to a frequency control terminal 33. The frequency of the fundamental wave oscillated in this high-frequency oscillator circuit is changed through the frequency control voltage $V_{CTL}$. A power supply voltage $V_{CC}$ is supplied to a power supply terminal 34. A bypass capacitor 35 is inserted between the power supply terminal 34 and ground.

Resistors 36 to 40 and constant current circuits 41 and 42 serve to bias the transistors 23 and 24 so that each of the transistors 23 and 24 operates at a predetermined operating point by the power supply voltage $V_{CC}$. Further, feedback capacitors 43 to 46 are provided. Each of the pair of the capacitors 43 and 44 and the pair of the capacitors 45 and 46 are selected so as to be uniform in characteristics and capacitance value.

The bases of the transistors 23 and 24 are connected to fundamental wave output terminals 49 and 50 through signal extraction resistors 47 and 48, respectively. A connection point 51 between the capacitors 45 and 46 and a connection point 52 between the transistors 23 and 24 are connected to second harmonic output terminals 53 and 54 for outputting the second harmonic, respectively. The connection points 51 and 52 are virtual grounding points (balance neutral points) of this high-frequency oscillator circuit.

An oscillation frequency of the high-frequency oscillator circuit in accordance with this embodiment is determined by the values of the inductor 25, the tuning variable capacity diode 26, the capacitor 27 and the frequency control voltage $V_{CTL}$, and fundamental wave components having this frequency exist as balanced signals between the bases of the transistors 23 and 24. The balanced signals applied between the transistors 23 and 24 may have equal amplitudes and frequencies while being out of phase. In this case, second harmonic components cancel each other between the bases of the transistors 23 and 24, and fundamental waves can therefore be extracted efficiently through the fundamental wave output terminals 49 and 50.

At the connection points 51 and 52, the phase difference between high-frequency currents of the fundamental wave flowing from the transistors 23 and 24 is 180°, and the high-frequency currents of the second harmonic are in phase with each other. Accordingly, fundamental wave components cancel each other thereat, while second harmonic components intensify each other. Second harmonic waves can therefore be output efficiently through the second harmonic output terminals 53 and 54. In this case, however, the phase difference between the second harmonic waves outputted from the second harmonic output terminals 53 and 54 is 180°.

An experiment of outputting a fundamental wave at 450 MHz and a second harmonic wave at 900 MHz from the above-described high-frequency oscillator circuit was made. Fundamental wave components outputted through the second harmonic output terminals 53 and 54 were at −32 dBm, while second harmonic components outputted from these terminals were at −8 dBm. Also, the C/N ratio of the second harmonic was smaller than the C/N ratio of the fundamental wave by 6 dB, which is an ideal value. Thus, at the balance neutral points, there is no influence of the fundamental wave, and the C/N ratio of the second harmonic is improved. Therefore, the high-frequency oscillator circuit can be formed as a monolithic integrated oscillator circuit of a 2 to 4 GHz band. Also, in the high-frequency oscillator circuit of the invention, the second harmonic waves do not substantially influence the oscillation of the fundamental waves and, therefore, the C/N ratio of the fundamental waves is substantially equal to that in an oscillator outputting no second harmonic waves.

In a case where a down converter is formed by using the high-frequency oscillator circuit of the present invention, if a second harmonic wave is used for a local oscillator and a fundamental wave for a phase lock loop, the maximum operating frequency of a prescaler of the phase lock loop is reduced to half, and the power consumption can be reduced by this effect.

Figure 2:
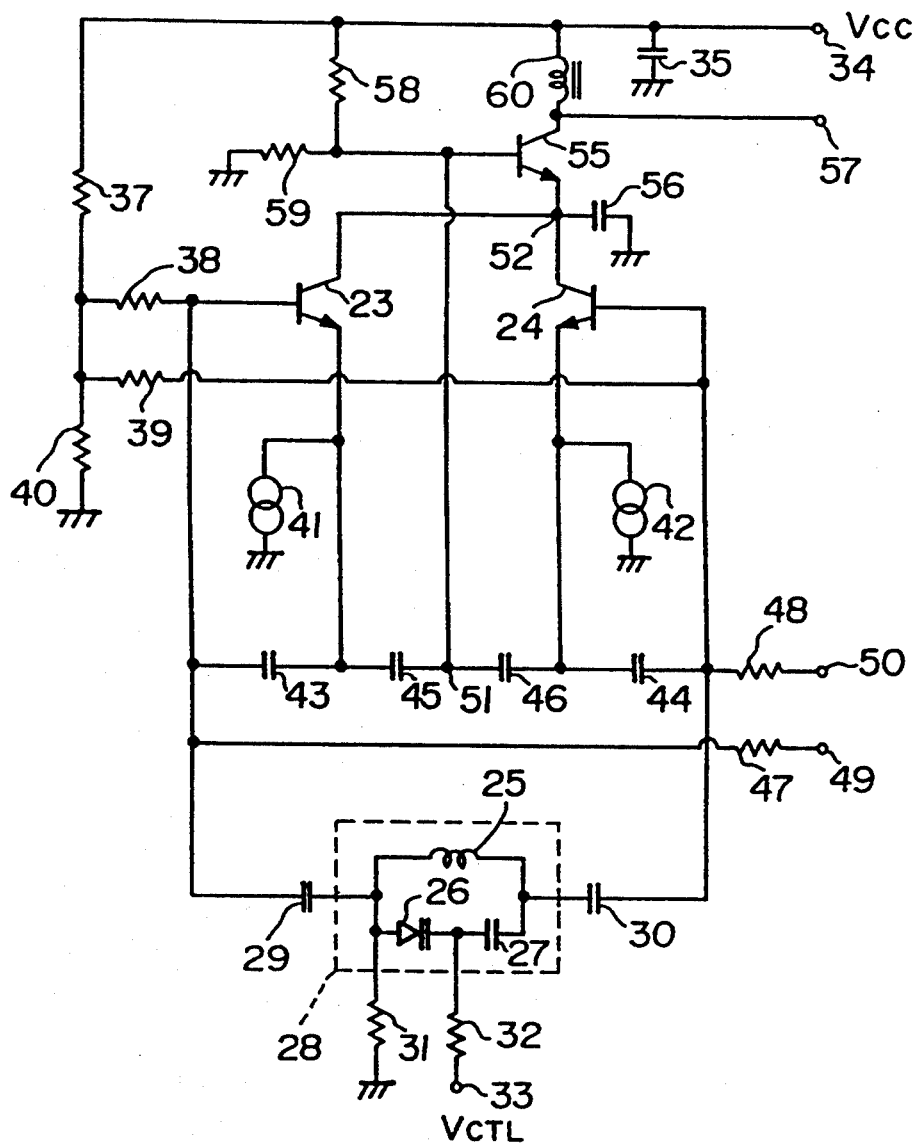
FIG. 2 is a circuit diagram of a high-frequency oscillator circuit in accordance with a second embodiment of the present invention.
Figure 3:
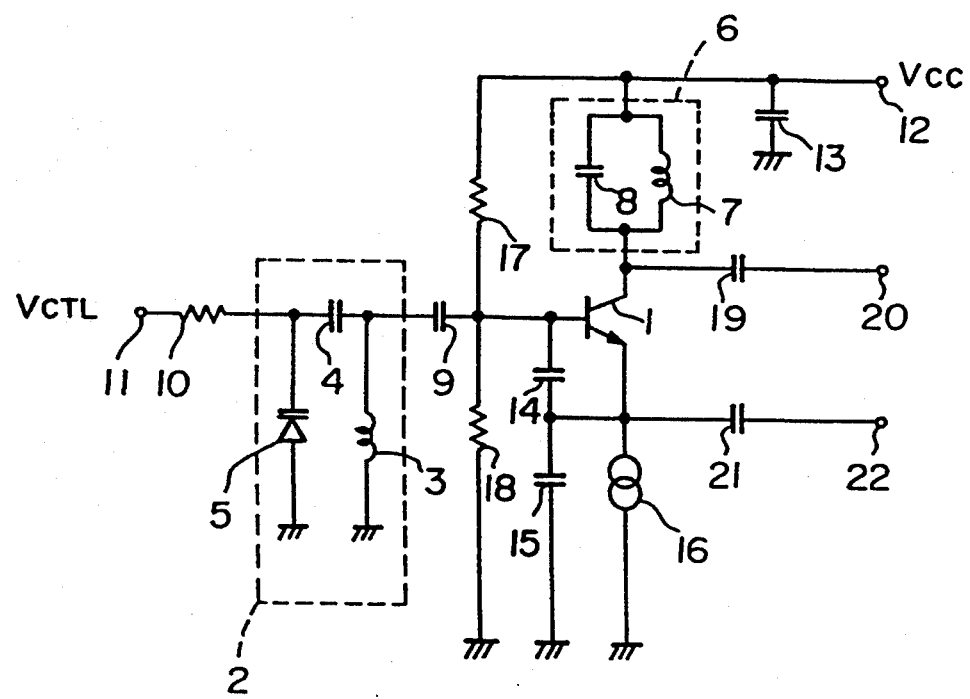
FIG. 3 is a circuit diagram of a conventional high-frequency oscillator circuit.

FIG. 2 is a circuit diagram of a high-frequency oscillator circuit in accordance with a second embodiment of the present invention. This high-frequency oscillator circuit is also a Colpitts oscillator circuit as in the first embodiment. Components of this circuit corresponding to those shown in FIG. 1 are indicated by the same reference characters and will not be particularly mentioned.

In this circuit, the base of a transistor 55 used as a buffer amplifier is connected to the above-mentioned connection point 51, and the emitter of the transistor 55 is connected to the connection point 52 and is grounded through a grounding capacitor 56. The collector of the transistor 55 is connected to a second harmonic output terminal through which a second harmonic wave is outputted. Resistors 58 and 59 and an RF choke coil 60 serve to bias the transistor 55 so that the transistor 55 operates at a predetermined operating point by the power supply voltage $V_{CC}$. The operation of this embodiment is the same as that of the first embodiment except that the second harmonic outputted through the second harmonic output terminal 57 is an unbalanced signal.

According to the present invention, as described above, there is no need to use any second harmonic resonance circuit, and it is therefore possible to output second harmonic waves at a high generally-constant level through a wide frequency range. Also, the C/N ratio of each of the fundamental and second harmonic waves is improved, and the oscillator circuit of the invention can be formed as an integrated circuit.

What is claimed is:

1. A high-frequency oscillator circuit comprising:
   first and second transistors for high-frequency oscillation, said first and second transistors having collectors connected to each other;
   a first impedance circuit connected between a base and an emitter of said first transistor;
   a second impedance circuit connected between a base and an emitter of said second transistor;
   a third impedance circuit connected between the emitters of said first and second transistors, the third impedance circuit including a balanced neutral point; and
   a fourth impedance circuit connected between the bases of said first and second transistors;
   wherein a second harmonic wave is outputted from the balanced neutral point of the third impedance circuit.

2. The high-frequency oscillator circuit of claim 1 further comprising an amplifying circuit connected between said balanced neutral point of the third impedance circuit and the collectors of the first and second transistors, wherein said second harmonic wave is outputted from a terminal of said amplifying circuit.

3. The high-frequency oscillator circuit of claim 2 wherein said amplifying circuit comprises:
   a resistor;
   a third transistor having a base connected to said resistor and to balance neutral point, and an emitter connected to the collectors of the first and second transistors; and an RF choke coil coupled to a collector of said third transistor.

4. The high-frequency oscillator circuit of claim 1, wherein the third impedance circuit comprises a plurality of serially-connected impedance elements, and the balance neutral point is located between two of the serially-connected impedance elements.

5. The high-frequency oscillator circuit of claim 4, wherein the plurality of serially-connected impedance elements comprise a pair of capacitors.

* * * * *